(12) United States Patent
Kim et al.

(10) Patent No.: US 6,326,252 B1
(45) Date of Patent: Dec. 4, 2001

(54) METHOD FOR FABRICATING MOS TRANSISTOR HAVING DUAL GATE

(75) Inventors: Sang Hyun Kim; Nam Hoon Cho, both of Chungcheongbuk-do; Jae Sung Roh, Kyonggi-do; Jeong Mo Hwang, Daejeon-si, all of (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/481,321

(22) Filed: Jan. 11, 2000

(30) Foreign Application Priority Data

Jan. 12, 1999 (KR) .................................. 628/1999

(51) Int. Cl.[7] .................................. H01L 21/8238

(52) U.S. Cl. .................. 438/199; 438/201; 438/232; 438/218

(58) Field of Search .................... 438/198, 199, 438/201, 207, 211, 218, 223, 224, 228, 230, 231, 232

(56) References Cited

U.S. PATENT DOCUMENTS

| | | | |
|---|---|---|---|
| 4,350,541 | * 9/1982 | Mizushima et al. | 148/188 |
| 5,190,888 | * 3/1993 | Schwalke et al. | 437/57 |
| 5,563,093 | * 10/1996 | Koda et al. | 437/101 |
| 5,654,242 | * 8/1997 | Komatsu | 438/585 |
| 5,683,920 | * 11/1997 | Lee | 437/34 |
| 5,710,450 | * 1/1998 | Chau et al. | 257/344 |
| 5,770,494 | * 6/1998 | Yamamoto et al. | 430/232 |
| 5,933,721 | * 8/1999 | Hause et al. | 438/217 |
| 5,970,351 | * 10/1999 | Takeuchi | 438/300 |
| 5,989,950 | * 11/1999 | Wu | 438/228 |
| 6,165,826 | * 12/2000 | Chau et al. | 438/231 |
| 6,221,724 | * 4/2001 | Yu et al. | 438/289 |

OTHER PUBLICATIONS

Wolf S., and Tauber R. "Silicon Processing for the VLSI Era: vol. 1 Process Technology", pp. 305–308, 1986.*
Wolf S. and Tauber R. "Silicon Processing for the VLSI Era" vol. 1 Process Technology, pp. 200–201, 1986.*
1997 Symposium on VLSI Technology Digest of Technical Papers; Gate Electrode Engineering by Control of Grain Growth for High Performance and High Reliable 0.18$\mu$m Dual Gate CMOS p 107~p 108.

* cited by examiner

*Primary Examiner*—Matthew Smith
*Assistant Examiner*—Renzo N. Rocchegiani
(74) *Attorney, Agent, or Firm*—Fleshner & Kim, LLP

(57) ABSTRACT

Methods of forming a MOS transistor having dual gates minimizes impurity channeling and diffusion that can occur during impurity injection and activating processes. A method of fabricating the transistor includes the steps of forming a first conduction type well and a second conduction type well in a semiconductor substrate having an isolation region and an active region formed therein. Then, a gate oxide film is formed on an entire surface of the substrate, and a polysilicon layer is deposited on the gate oxide film preferably at a temperature of about 660° C. to about 700° C. and a pressure of about 10 to about 300 Torr. Next, portions of the polysilicon layer and the gate oxide film are selectively removed to form a gate electrode on each of the wells. Impurity ions are injected, having a conduction type opposite a conduction type of the corresponding well, into an exposed surface of each of the wells, to form lightly doped impurity regions. Insulating film sidewalls are formed at sides of each of the gates. Then, first conduction type impurity ions are heavily injected into a surface of the exposed first conduction type well and into the gate electrode formed on the first conduction type well. Also, second conduction type impurity ions are heavily injected into a surface of the exposed second conduction type well and into the gate electrode formed on the second conduction type well. Next, a first heat treatment is conducted in an oxygen ambient and a second heat treatment is conducted in a nitrogen ambient, to diffuse the impurities.

20 Claims, 10 Drawing Sheets

FIG.4a
660C
Normal poly-Si

FIG.4b
680C
Fine-poly Si

FIG.4c
700C
Columnar poly-Si

METHOD FOR FABRICATING MOS TRANSISTOR HAVING DUAL GATE

BACKGROUND OF THE INVENTION

1. Field of the Invention

The present invention relates to a method for fabricating a semiconductor device, and more particularly, to a method for fabricating a MOS transistor.

2. Background of the Related Art

FIGS. 1a to 1h illustrate cross sectional views showing the steps of a related art method for fabricating a MOS transistor having dual gates. FIG. 2 shows a related art ion injection state.

Figure 1A:
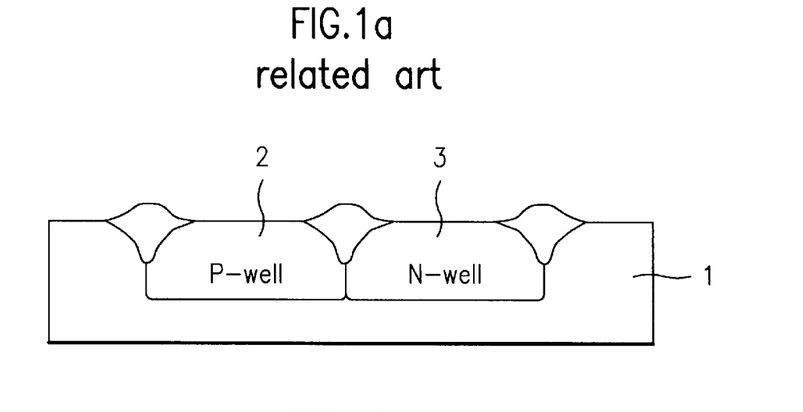
FIGS. 1a to 1h illustrate the steps of a related art method for fabricating a MOS transistor having dual gates.
Figure 1B:
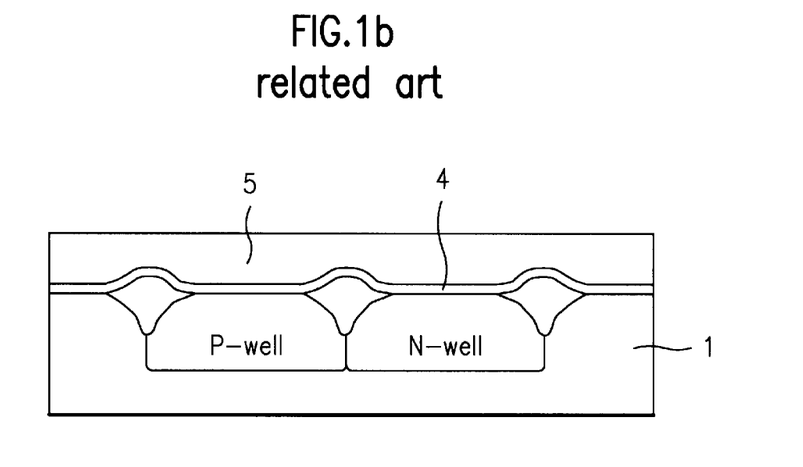
Figure 1C:
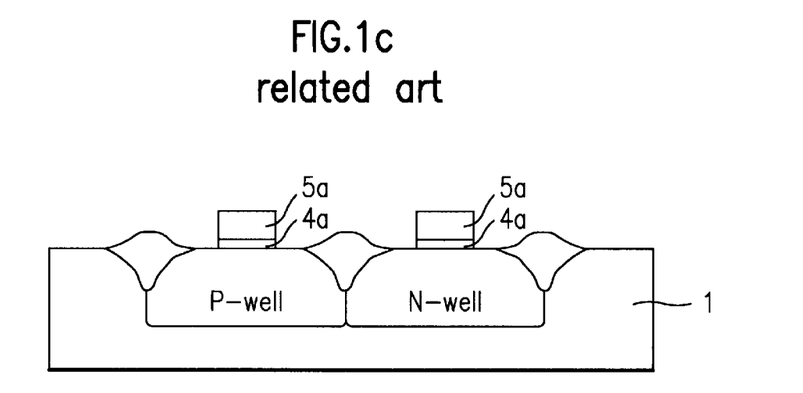
Figure 2:
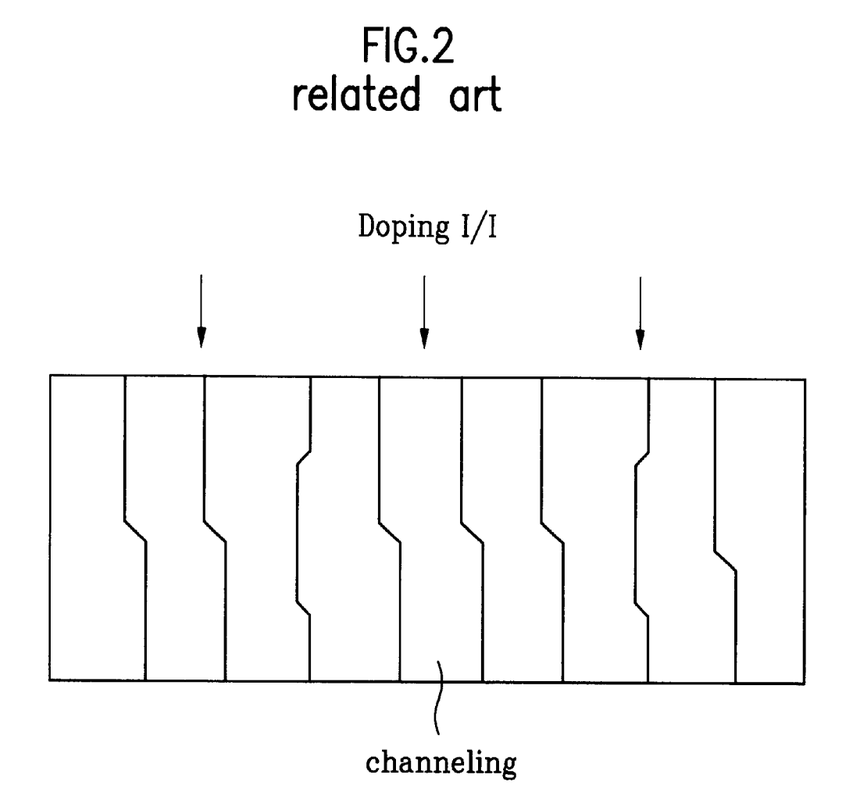
FIG. 2 illustrates a state of a related art ion injection based on the method illustrated in FIGS. 1a to 1h.

As shown in FIG. 1a, P type impurity ions and N type impurity ions are respectively injected into isolated regions of a semiconductor substrate 1 to form a P type well 2 and an N type well 3. As shown in FIG. 1b, a gate oxide film 4 is formed on an active region and a polysilicon layer 5 is deposited on the gate oxide film 4. The polysilicon layer 5 is deposited at approx. 610° C. using $SiH_4$ gas, for the purpose of forming small grain sizes. As shown in FIG. 1c, the polysilicon layer 5 and the gate oxide film 4 are selectively removed, to form a gate electrode 5a and a gate oxide film portion 4a on each of the P type well 2 and the N type well 3.

Figure 1D:
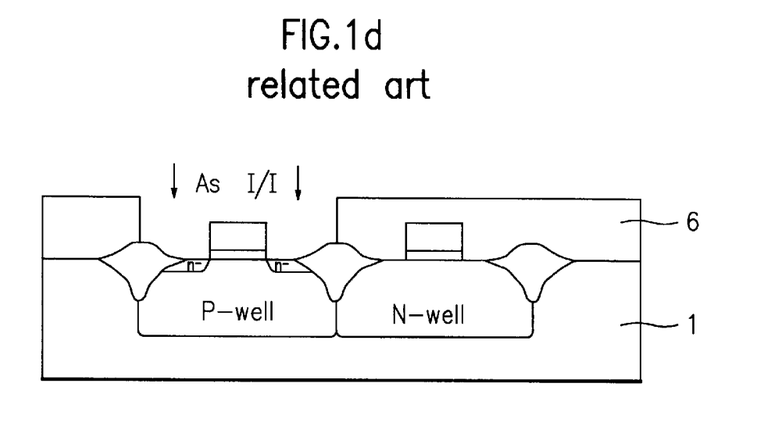
Figure 1E:
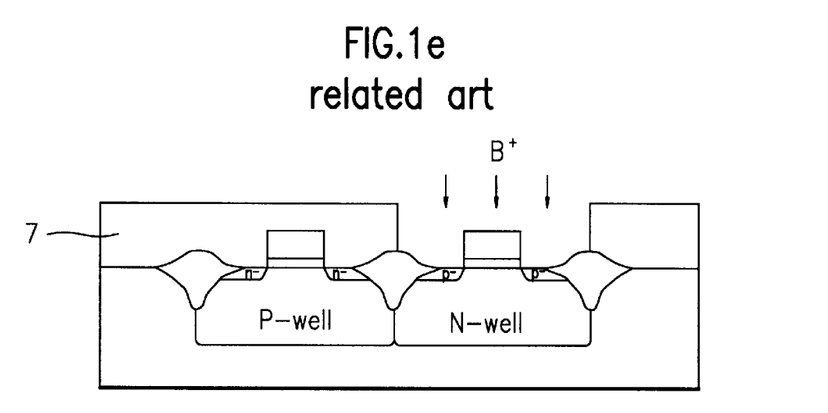

As shown in FIG. 1d, a first photoresist film 6 is formed on the substrate 1 such that it covers the N type well 3, but not the P type well 2. Then, N type arsenic (As) impurity ions are lightly injected into the exposed surface of the P type well 2. As shown in FIG. 1e, the first photoresist film 6 is removed. Next, a second photoresist film 7 is formed on the substrate 1 such that it covers the P type well 2, but not the N type well 3. Then, P type boron ($B^+$) impurity ions are lightly injected into the exposed surface of the N type well 3.

Figure 1F:
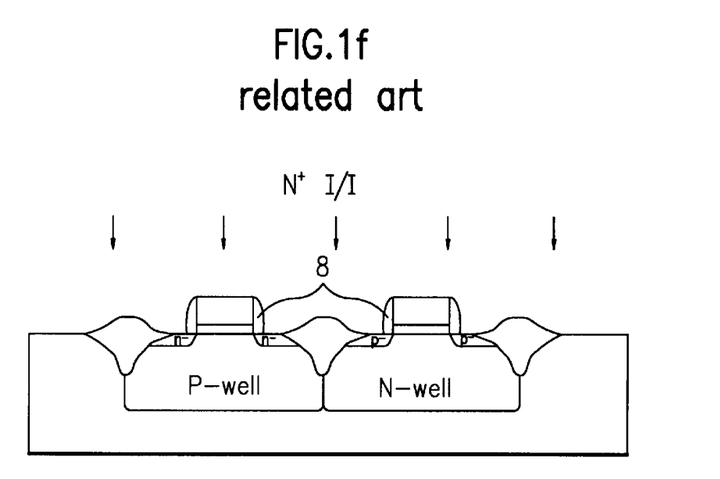

As shown in FIG. 1f, the second photoresist film 7 is removed, and an oxide film is deposited by chemical vapor deposition (CVD) on the entire upper surface. The oxide film is subjected to anisotropic etching to form oxide film sidewalls 8 at the sides of each gate electrode 5a. Then, nitrogen ions are injected into the gate oxide film 4a and the oxide film sidewalls 8. The nitrogen ions are injected for preventing penetration of boron ($B^+$) from the P type gate electrode 5a during a heat treatment in a later process.

Figure 1G:
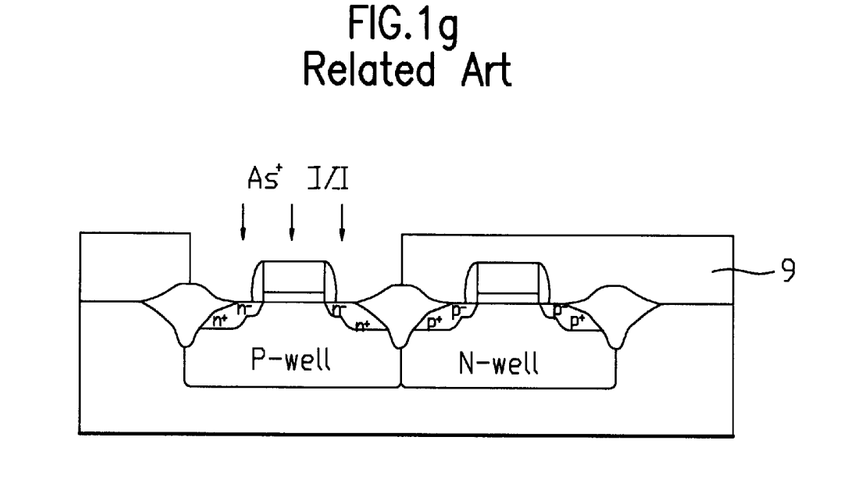
Figure 1H:
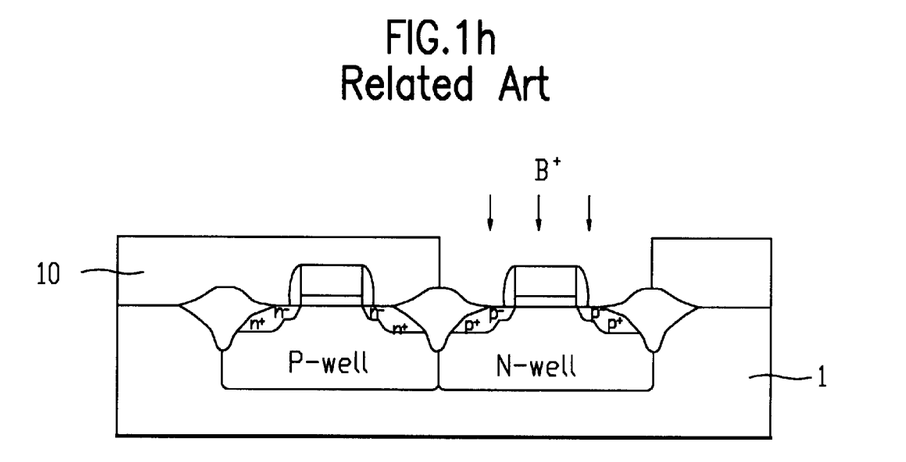

As shown in FIG. 1g, a third photoresist film 9 is formed on the entire surface of the transistor, except for the P type well 2. Then, N type impurity ions of arsenic ($As^+$) are heavily injected into both a surface of the exposed P type well 2 and to the N type gate electrode 5a. Next, as shown in FIG. 1h, the third photoresist film 9 is removed, and a fourth photoresist film 10 is formed on the entire surface except for the N type well region 3. P type impurity ions of boron ($B^+$) are heavily injected into both a surface of the exposed N type well 3 and into the P type gate electrode 5a. Then, the fourth photoresist film 10 is removed, and a heat treatment is conducted at approx. 1000° C. in a nitrogen ambient, to diffuse impurity ions.

The related art method for fabricating an MOS transistor having dual gates has at least the following problems, as shown, for example, in FIG. 2, which illustrates a state of a related art ion injection into a gate electrode.

First, amorphous or columnar silicon is deposited for forming a dual gate electrode. However, a heat treatment in an amorphous state causes depletion in an NMOS region, and the heat treatment of the columnar structure alters device characteristics due to channeling during ion injection. A diffusion speed of the boron in a NMOS region is significantly faster than a diffusion speed of the arsenic in a NMOS region. If the heat treatment is completed long after the injection of arsenic and boron, the boron passes the gate oxide film 4a and invades the substrate 1, which results in channeling. If the time period of the heat treatment is short, the slow diffusion speed of the arsenic in the NMOS region causes depletion of the NMOS region. Moreover, the columnar polysilicon has a preferred orientation in a plane (110) that is very susceptible to channeling during ion injection, while polysilicon, other than amorphous or columnar, has a preferred orientation in a plane (111). In this environment, boron with a smaller ion radius causes channeling which enhances boron penetration during heat treatment and changes characteristics of the device.

Second, as discussed above, nitrogen ions are injected into the gate insulating film 4a before impurity ions are heavily injected into the P type gate electrode 5a. Although penetration of boron injected into the P type gate electrode into regions below the gate insulating film can be prevented during the heat treatment, reduction of an impurity concentration in the N type gate electrode cannot be prevented in the related art approach because arsenic ions injected into the N type gate electrode are outwardly diffused. Accordingly, device characteristics of the NMOS region deteriorate in the related art method.

SUMMARY OF THE INVENTION

An object of the present invention is to substantially obviate one or more of the problems due to limitations and disadvantages of the related art.

Another object of the present invention is to suppress dopant depletion in a NMOS region.

Still another object of the present invention is to suppress boron penetration into a PMOS region.

Yet another object of the present invention is to minimize outward diffusion of impurities injected into a gate electrode.

Yet still another object of the present invention is to reduce a sheet resistivity of the gate electrode.

A further object of the present invention is to minimize impurity channeling and diffusion.

The objects of the present invention can be achieved in a whole, or in part, by fabricating a MOS transistor having dual gates. A first conduction type well and a second conduction type well are formed in a semiconductor substrate having an isolation region and an active region formed therein. A gate oxide film on an entire surface of the substrate is formed, and polysilicon layer is deposited on the gate oxide film, preferably at 660° C.~700° C. and 10~300 Torr. The polysilicon layer and the gate oxide film are selectively removed to form a gate electrode on each of the wells. Impurity ions having a conduction type opposite to a corresponding well is injected into an exposed surface of the respective well, to form lightly doped impurity regions. Insulating film sidewalls are formed at sides of each of the gates.

Next, first conduction type impurity ions, having a conduction type opposite the conduction type of the first conduction type well, are heavily injected into a surface of the exposed first conduction type well and into the gate electrode formed on the first conduction type well. Second conduction type impurity ions, having a conduction type opposite the conduction type of the first conduction type well, are heavily injected into a surface of the exposed second conduction type well and into the gate electrode formed on the second conduction type well. Then a first heat treatment is conducted in an oxygen ambient, and a second heat treatment is conducted in a nitrogen ambient, to diffuse impurities.

The objects of the present invention can also be achieved in a whole, or in part, by fabricating a transistor having dual gates. A first heat treatment of first and second doped impurity regions of a semiconductor device is conducted in an oxygen ambient. A second heat treatment of the first and second doped impurity regions of the semiconductor device is conducted in a nitrogen ambient to reduce a sheet resistivity of the dual gates.

In addition, the objects of the present invention can be achieved in a whole, or in part, by a method of fabricating a transistor. A gate oxide film is formed, at about 660° C. to about 700° C., and at a pressure of about 10 to 300 Torr, over first and second conduction type wells of a semiconductor substrate having corresponding first and second conduction types. A polysilicon layer is then deposited over the gate oxide film. Next, portions of the polysilicon layer and the gate oxide film are selectively removed to form a gate electrode over each of the first and second conductive wells. Then, ions having a conduction type opposite to the conduction type of the corresponding first and conduction type wells are injected to form corresponding first and second doped impurity regions, and a diffusing treatment of the first and second doped impurity regions is conducted.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein.

DETAILED DESCRIPTION OF PREFERRED EMBODIMENTS

Figure 3A:
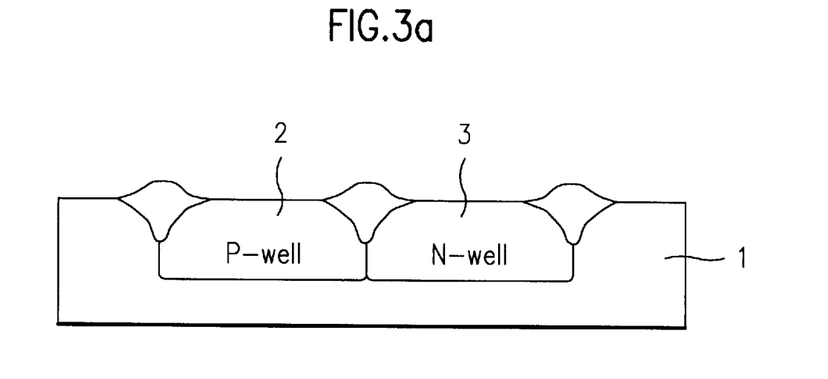
FIGS. 3a to 3h illustrate the steps of a method for fabricating a MOS transistor having dual gates in accordance with a preferred embodiment of the present invention.
Figure 3B:
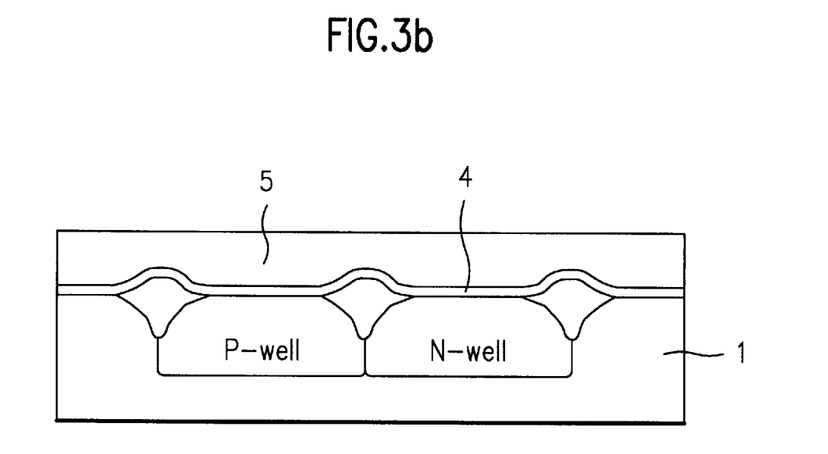
Figure 4A:
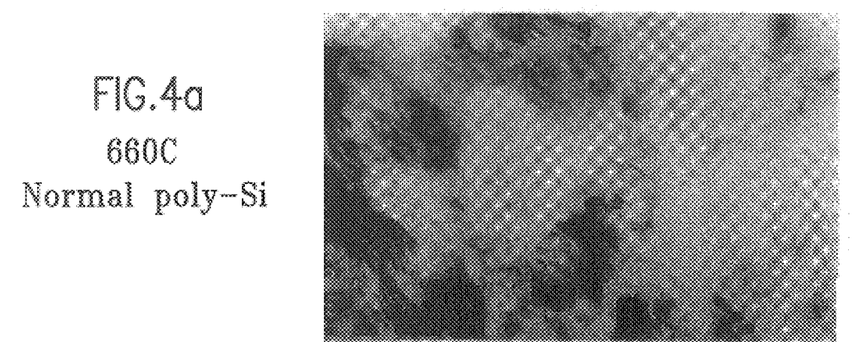
FIGS. 4a to 4c illustrate states of polysilicon deposition in accordance with a preferred embodiment of the present invention; and, FIGS. 5a and 5b illustrate graphs for comparing sheet resistivities after heat treatment of a MOS transistor in accordance with the related art and a preferred embodiment of the present invention.
Figure 4B:
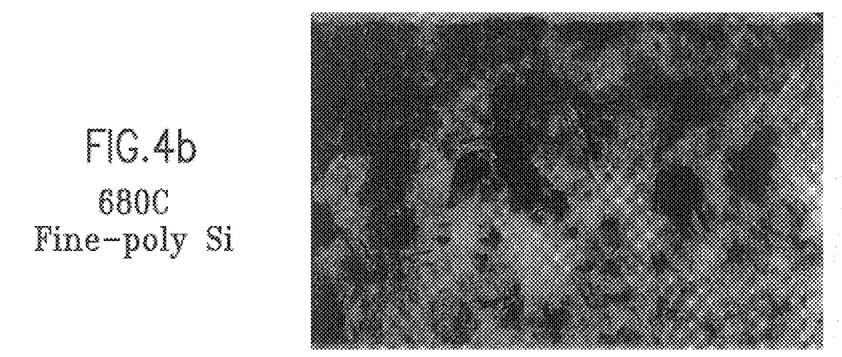
Figure 4C:
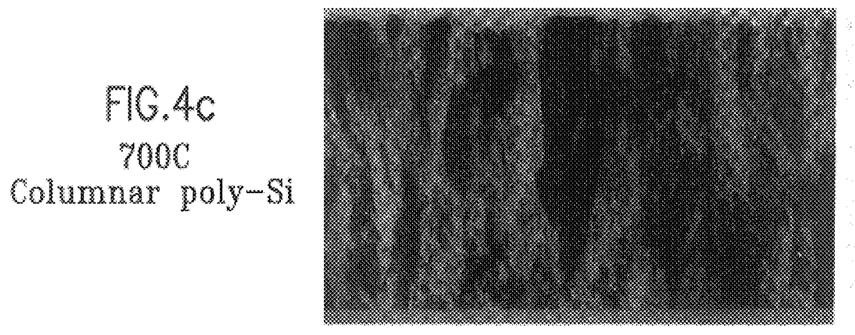

Referring to FIG. 3a, P type impurity ions and N type impurity ions are respectively injected into an isolation region of a semiconductor substrate 1, to form a P type well 2 and an N type well 3. A barrier is formed at an interface of the P type well 2 and the N type well 3, and along the isolation region. As shown in FIG. 3b, a gate oxide film 4 is formed on an entire surface of the semiconductor substrate shown in FIG. 3a, and a polysilicon layer 5 is deposited on the gate oxide film 4. The polysilicon layer 5 is deposited by decomposing $SiH_4$ gas at about 660° C. to 700° C. under 10 to 300 Torr pressure, so that the fine grains are overlapped, but the formation of columnar structure is avoided. FIG. 4 illustrates a state at deposition of polysilicon after the decomposing step at temperatures of 660° C., 680° C. and 700° C., respectively. As shown in FIG. 4, fine grains are overlapped without the formation of columnar structure.

Figure 3C:
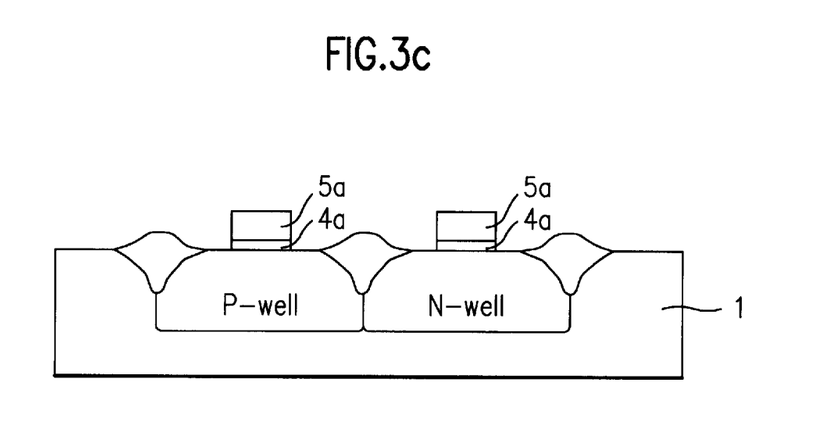
Figure 3D:
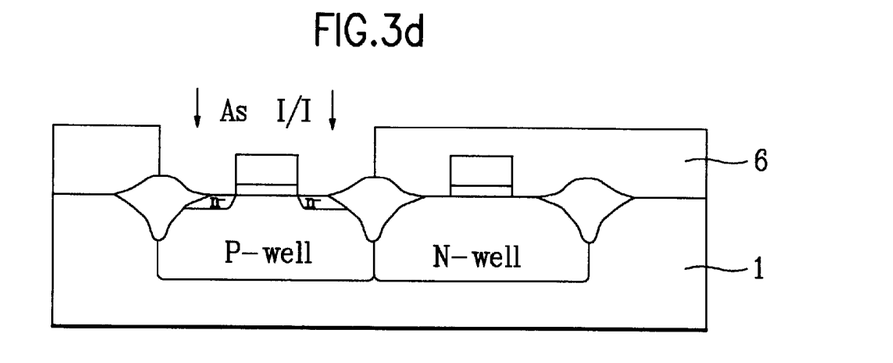

As shown in FIG. 3c, the polysilicon layer 5 and the gate oxide film 4 are selectively removed to form a gate electrode 5a and a gate oxide film portion 4a on each of the P type well 2 and the N type well 3. As shown in FIG. 3d, a first photoresist film 6 is formed on the substrate 1 such that it does not cover the P type well 2. Then, N type (As) impurity ions are lightly injected into an exposed surface of the P type well 2.

Figure 3E:
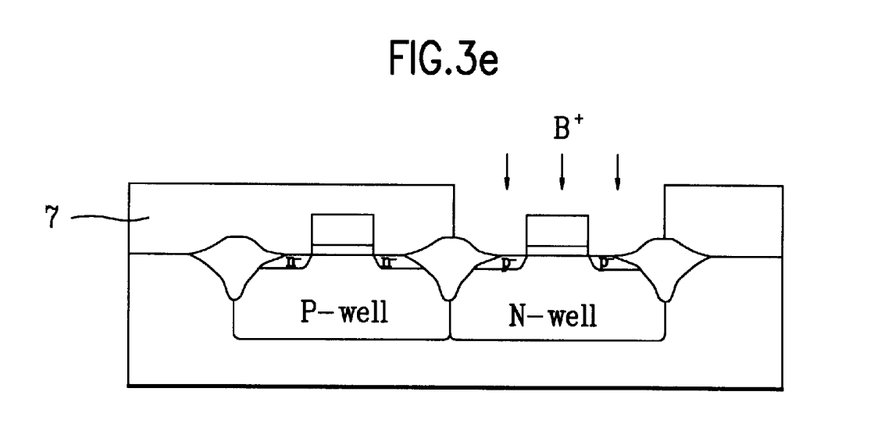
Figure 3F:
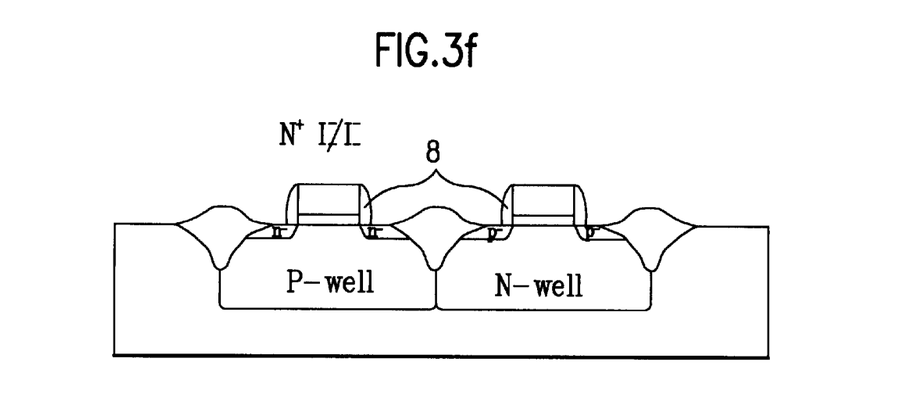

As shown in FIG. 3e, the first photoresist film 6 is removed and a second photoresist film 7 is form on the substrate 1 and the P type gate electrode 5a. However, the second photoresist film 7 does not cover the N type well 3. Next, P type ($B^+$) impurity ions are lightly injected into an exposed surface of the N type well 3. As shown in FIG. 3f, the second photoresist film 7 is removed, and an oxide film is deposited by CVD on the entire surface. The oxide film is subjected to anisotropic etching to form oxide film sidewalls 8 at the sides of each gate electrode 5a. Then, nitrogen ions are injected into the gate oxide film 4a and the oxide film sidewalls 8. The nitrogen is injected for preventing penetration of boron ($B^+$) from the P type gate electrode 5a to the substrate during heat treatment in a later process.

Figure 3G:
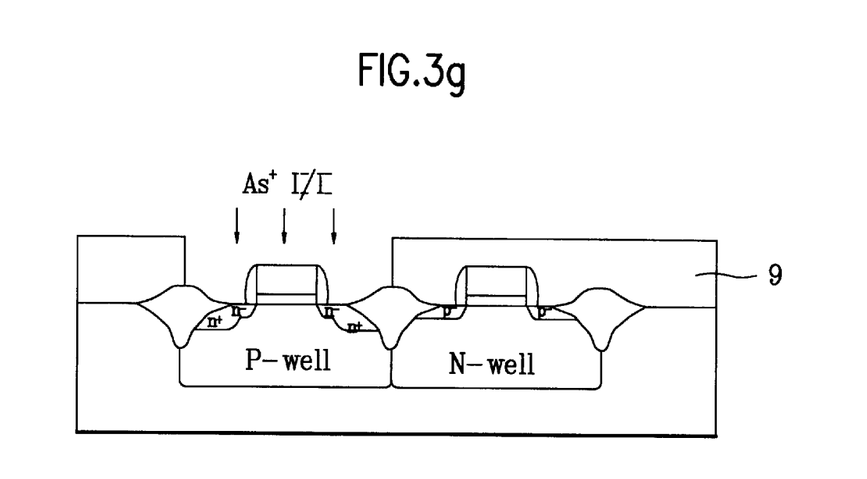
Figure 3H:
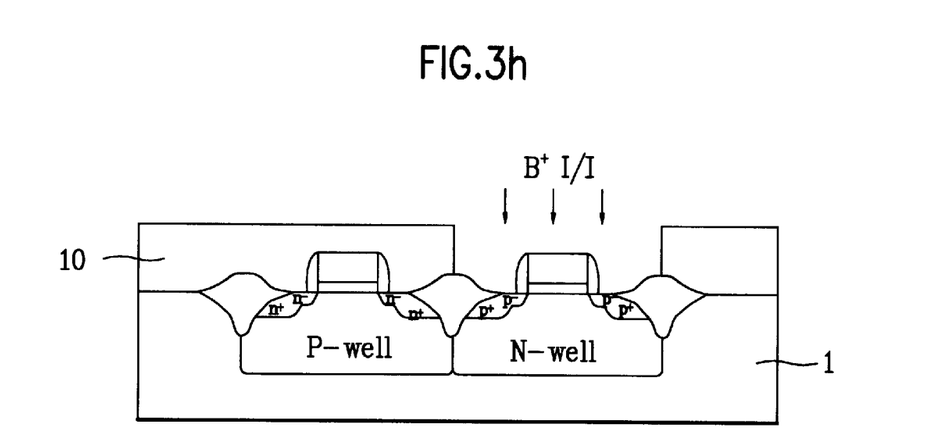

As shown in FIG. 3g, a third photoresist film 9 is formed on the entire surface of the transistor, except for the P type well. Then, N type impurity ions of arsenic (As+) are heavily injected into a surface of the exposed P type well 2 and to the N type gate electrode 5a. As shown in FIG. 3h, the third photoresist film 9 is removed, and a fourth photoresist film 10 is formed on the entire surface of the transistor, except for the N type well. P type impurity ions of boron ($B^+$) are heavily injected into a surface of the exposed N type well 3, and to the P type gate electrode 5a. Then, the fourth photoresist film 10 is removed.

Next, in the preferred embodiments, a first heat treatment is conducted at 600 to 800° C., and most preferably at 700° C. in an oxide ($O_2$) ambient. Then, a second heat treatment is conducted at 900° C. to 1100° C. in a nitrogen ambient, to diffuse impurities.

Figure 5A:
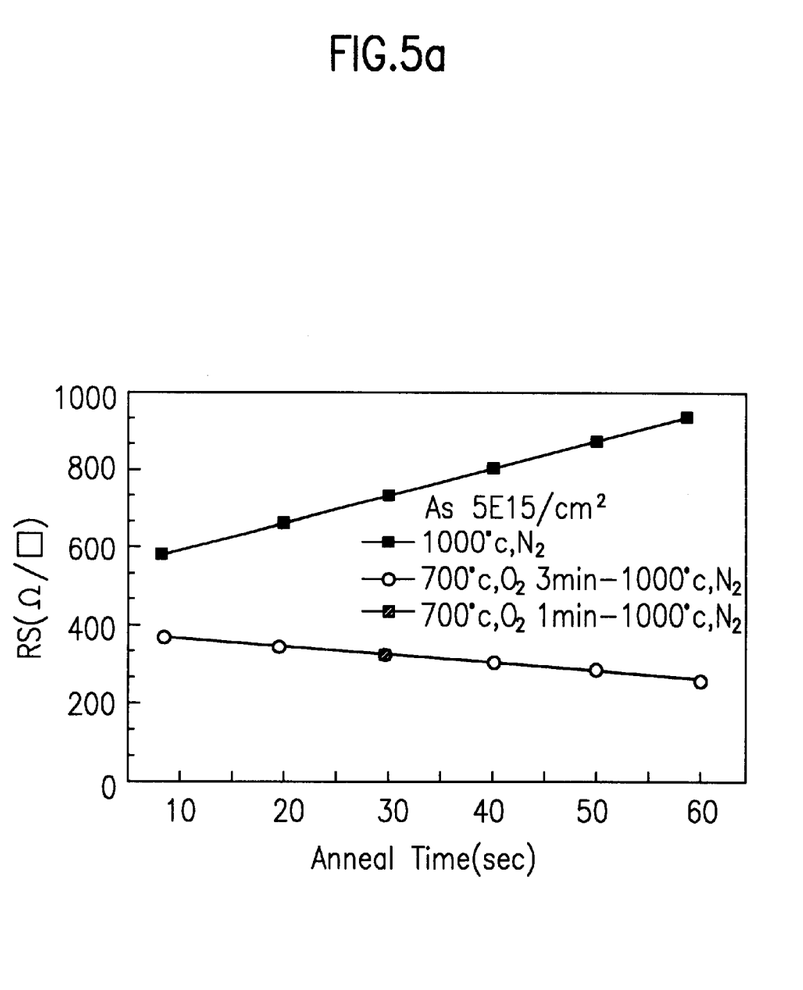
Figure 5B:
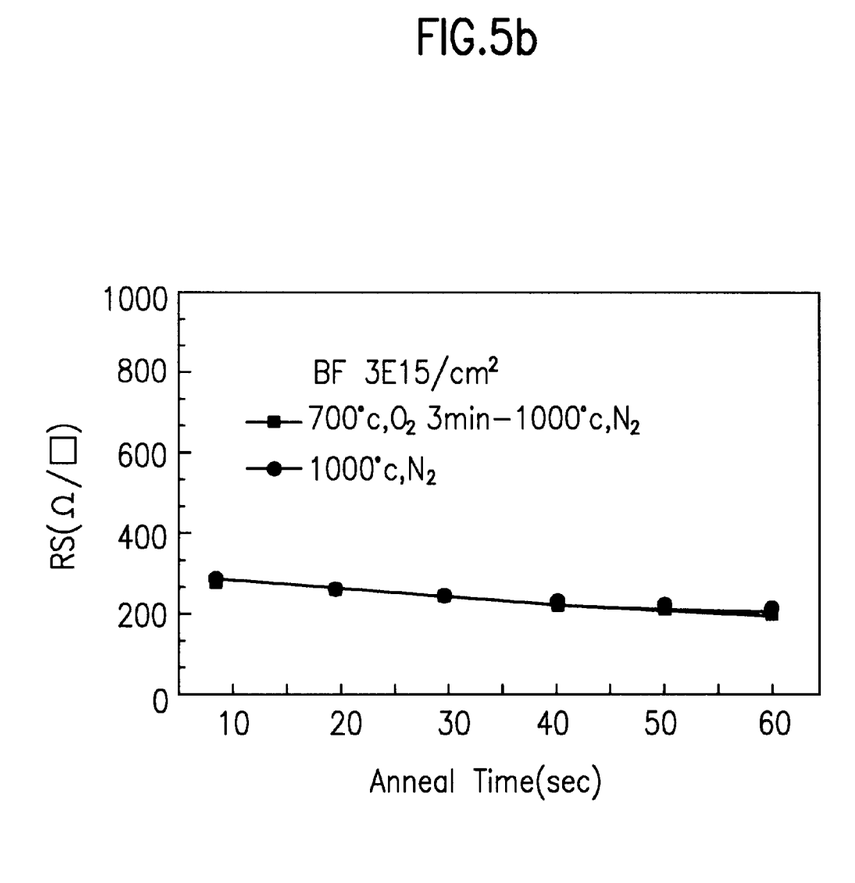

FIGS. 5a and 5b illustrate sheet resistivities after the heat treatments of MOS transistors in accordance with the related art and the present invention. As shown in FIG. 5a, arsenic ions are doped at $5 \times 10^{15}$ atoms/$cm^2$ and heat treatment is conducted at 1000° C. in a nitrogen ambient in accordance with the related art. Another group of arsenic ions are doped at $5 \times 10^{15}$ atoms/$cm^2$ and heat treatment is conducted at about 700° C. in an oxygen ambient, and then at about 1000° C. in a nitrogen ambient for one or three minutes in accordance with the preferred embodiments of the present invention.

As shown in FIG. 5b, $BF_2$ ions are doped at $3 \times 10^{15}$ atoms/$cm^2$ and heat treatment is conducted at 1000° C. in a nitrogen ambient in accordance with the related art, and separately, at about 1000° C. in a nitrogen ambient for approx. three minutes after heat treatment at about 700° C. in an oxygen ambient, in accordance with a preferred embodiment of the present invention. Sheet resistivities in cases of both the related art and the present invention are similar when $BF_2$ ions are injected. However, when arsenic ions are injected, the sheet resistivity from the heat treatments of the preferred embodiments of the present invention is substantially lower than the sheet resistivity from the heat treatment of the related art. The results show that the injected arsenic ions are discharged outwardly during the heat treatment of the related art, while the injected arsenic ions are not discharged outwardly during the heat treatment of the preferred embodiments of the present invention.

Accordingly, the method for fabricating an MOS transistor having dual gates in accordance of the preferred embodiments of the present invention has at least the following advantages. The overlapped formation of fine grains without formation of the columnar structure resulting from deposition of polysilicon at about 660° C. to 700° C. under 10 to 300 Torr in the formation of the gate electrode prevents boron penetration toward the substrate through the gate oxide film. The overlapped formation prevents boron penetration, even if the boron has a faster diffusion speed than the arsenic when boron and arsenic are used as impurities in fabrication of an MOS transistor having dual gates with channeling. This approach allows enough time for arsenic to diffuse inwardly, and prevents NMOS depletion.

In addition, because outward diffusion of arsenic ions injected into the gates of an NMOS transistor is prevented after an arsenic ion injection, by a first heat treatment at about 600 to 800° C. in an oxygen ambient, and then by a second heat treating at about 900 to 1100° C. in a nitrogen ambient, in a heat treatment process, a sheet resistivity of the gate electrode is reduced and operation characteristics of the transistor are improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of fabricating a transistor, comprising:
    (a) forming a first conduction type well and a second conduction type well in a semiconductor substrate having an isolation region and an active region formed therein;
    (b) forming a gate oxide film over an entire surface of the semiconductor substrate, and depositing a polysilicon layer over the gate oxide film;
    (c) selectively removing portions of the polysilicon layer and the gate oxide film to form a polysilicon gate electrode on each of the wells;
    (d) injecting impurity ions into each of the wells, to form lightly doped impurity regions;
    (e) injecting first conduction type impurity ions, having a conduction type opposite to the conduction type of the first conduction type well, into a surface of the first conduction type well and into the polysilicon gate electrode formed on the first conduction type well;
    (f) injecting second conduction type impurity ions, having a conduction type opposite to the conduction type of the second conduction type well, into a surface of the second conduction type well and into the polysilicon gate electrode formed on the second conduction type well; and
    (g) conducting a first heat treatment in an oxygen ambient and conducting a second heat treatment in a nitrogen ambient, for diffusing impurities.

2. The method of claim 1, wherein the first conduction type impurity ions include arsenic ions and the second conduction type impurity ions include boron ions.

3. The method of claim 1, wherein the first heat treatment is conducted at about 600° C. to about 800° C., and the second heat treatment is conducted at about 900° C. to about 1100° C.

4. The method of claim 3, wherein the second heat treatment is conducted for about one to three minutes.

5. The method of claim 1, further comprising forming insulating film sidewalls at first and second sidewalls of each gate, after performing step (d).

6. The method of claim 5, further comprising injecting nitrogen ions into the gate insulating film and into the insulating film sidewalls.

7. The method of claim 1, wherein the polysilicon film is formed at about 660° C. to about 700° C. at a pressure of about 10 to 300 Torr.

8. The method of claim 1, wherein in step (d), the impurity ions have a conduction type opposite a conduction type of each well, and are injected into an exposed surface of each well.

9. A method of fabricating a transistor having dual gates, comprising:
    forming a semiconductor device with dual gates including polysilicon having impurity ions injected therein and first and second conduction wells, the conduction wells having first and second doped impurity regions formed by ion injection;
    conducting a first heat treatment of first and second doped impurity regions of the semiconductor device in an oxygen ambient at about 600° C. to about 800° C.; and
    conducting a second heat treatment of the first and second doped impurity regions of the semiconductor device in a nitrogen ambient at about 900° C. to about 1100° C. for about one to three minutes to reduce a sheet resistivity of the dual gates.

10. The method of claim 9, wherein the step of forming a semiconductor device comprises:
    forming a gate oxide film over first and second conduction type wells of a semiconductor substrate having corresponding first and second conductivity types;
    depositing a polysilicon layer over the gate oxide film;
    selectively removing portions of the polysilicon layer and the gate oxide film to form a gate electrode over each of the first and second conduction type wells; and
    injecting impurity ions having a conduction type opposite to the conduction types of the corresponding first and second conduction type wells to form the first and second doped impurity regions.

11. The method of claim 10, wherein the semiconductor device is further formed by
    injecting first conduction type impurity ions into a surface of the first conduction type well and into the gate formed over the first conduction type well, and
    injecting second conduction type impurity ions into a surface of the second conduction type well and into the gate formed over the second conduction type well, wherein the first and second conduction type impurity ions have a conduction type opposite a conduction type of the respective first and second conduction type wells.

12. The method of claim 11, wherein the first conduction type impurity ions include arsenic ions and the second conduction type impurity ions include boron ions.

13. The method of claim 12, wherein the polysilicon film is formed at about between 660° C. to about 700° C. at a pressure of about 10 to 300 Torr to prevent boron penetration towards the semiconductor substrate through the gate oxide film.

14. The method of claim 10, further comprising forming insulating film first and second side walls of each gate.

15. The method of claim 14, further comprising injecting nitrogen ions into the gate insulating film and the insulating film sidewalls.

16. A method of fabricating a transistor, comprising:

(a) forming a gate oxide film over first and second conduction type wells of a semiconductor substrate having corresponding first and second conduction types;

(b) depositing a polysilicon layer over the gate oxide film at about 660° C. to about 700° C. at a pressure of about 10 to 300 Torr;

(c) selectively removing portions of the polysilicon layer and the gate oxide film to form a gate electrode over each of the first and second wells;

(d) injecting ions having a conduction type opposite to the conduction type of the corresponding first and second conduction type wells to form corresponding first and second doped impurity regions; and (e) conducting a diffusing treatment of the first and second doped impurity regions.

17. The method of claim 16, wherein the diffusing treatment includes a first heat treatment in an oxygen ambient, and a second heat treatment in a nitrogen ambient.

18. The method of claim 17, wherein the first heat treatment is conducted at about 700° C., and the second heat treatment is conducted at about 1000° C.

19. A method of fabricating a transistor having dual gates, comprising:

forming first and second doped conduction wells for a semiconductor device;

forming first and second gates over the conduction wells, the first and second gates including a layer of polysilicon formed at about 660° C. to about 700° C. at a pressure of about 10 to 300 Torr;

forming first and second doped impurity regions;

conducting a first heat treatment of the first and second doped impurity regions of the semiconductor device in an oxygen ambient; and conducting a second heat treatment of the first and second doped impurity regions of the semiconductor device in a nitrogen ambient to reduce a sheet resistivity of the first and second gates.

20. A method of fabricating a transistor, comprising:

forming a first conduction type well and a second conduction type well in a semiconductor substrate having an isolation region and an active region formed therein;

forming a gate oxide film over an entire surface of the semiconductor substrate, and depositing a polysilicon layer over the gate oxide film, the polysilicon layer being formed at about 660° C. to about 700° C. at a pressure of about 10 to 300 Torr;

selectively removing portions of the polysilicon layer and the gate oxide film to form a gate electrode on each of the wells;

injecting impurity ions into each of the wells, to form lightly doped impurity regions;

injecting first conduction type impurity ions, having a conduction type opposite to the conduction type of the first conduction type well, into a surface of the first conduction type well and into the gate electrode formed on the first conduction type well;

injecting second conduction type impurity ions, having a conduction type opposite to the conduction type of the second conduction type well, into a surface of the second conduction type well and into the gate electrode formed on the second conduction type well; and conducting first heat treatment in an oxygen ambient and conducting second heat treatment in a nitrogen ambient, for diffusing impurities.

* * * * *